United States Patent
Murayama et al.

(10) Patent No.: US 7,777,349 B2
(45) Date of Patent: Aug. 17, 2010

(54) SEMICONDUCTOR APPARATUS HAVING SIDE SURFACE WIRING

(75) Inventors: Kei Murayama, Nagano (JP); Shigeru Mizuno, Nagano (JP); Takashi Kurihara, Nagano (JP); Akinori Shiraishi, Nagano (JP); Mitsutoshi Higashi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 20 days.

(21) Appl. No.: 12/175,689

(22) Filed: Jul. 18, 2008

(65) Prior Publication Data
US 2009/0020889 A1 Jan. 22, 2009

(30) Foreign Application Priority Data
Jul. 20, 2007 (JP) .............................. 2007-188915

(51) Int. Cl.
H01L 23/48 (2006.01)
(52) U.S. Cl. .............................. 257/777; 257/E23.141
(58) Field of Classification Search ................. 257/686, 257/777, E23.141; 361/749
See application file for complete search history.

(56) References Cited

U.S. PATENT DOCUMENTS

| | | | | |
|---|---|---|---|---|
| 6,002,163 A * | 12/1999 | Wojnarowski | ............... | 257/620 |
| 6,984,885 B1 * | 1/2006 | Harada et al. | ............... | 257/696 |
| 7,180,168 B2 * | 2/2007 | Imai | ........................... | 257/686 |
| 7,271,466 B2 * | 9/2007 | Noma et al. | ................ | 257/621 |
| 7,342,320 B2 * | 3/2008 | Hedler et al. | ............... | 257/786 |
| 2007/0158807 A1 * | 7/2007 | Lu et al. | ..................... | 257/686 |
| 2008/0303131 A1 * | 12/2008 | McElrea et al. | ............. | 257/686 |
| 2009/0096076 A1 * | 4/2009 | Jung | ........................... | 257/686 |
| 2009/0146282 A1 * | 6/2009 | Tay et al. | .................... | 257/686 |
| 2009/0218669 A1 * | 9/2009 | Wang | ........................ | 257/686 |
| 2009/0230528 A1 * | 9/2009 | McElrea et al. | ............. | 257/676 |

FOREIGN PATENT DOCUMENTS

JP 2002-76167 3/2002

* cited by examiner

*Primary Examiner*—Nathan W Ha
(74) *Attorney, Agent, or Firm*—Drinker Biddle & Reath LLP

(57) ABSTRACT

A plurality of quadrilateral-shaped semiconductor elements are stacked on the one surface of a circuit substrate. A side surface wiring for making electrical connection between each of the electrode terminals of the semiconductor elements and a pad formed on the circuit substrate is formed by applying a conductive paste containing conductive particles. A metal wire whose one end is connected to the electrode terminal is extended along a tapered surface formed by cutting off an edge of the electrode terminal surface on which the electrode terminal is formed among edges formed along each of the sides of the semiconductor element. At least a part of the metal wire extended from each of the electrode terminals of the semiconductor elements to the tapered surface is electrically connected to the side surface wiring.

5 Claims, 9 Drawing Sheets

SEMICONDUCTOR APPARATUS HAVING SIDE SURFACE WIRING

TECHNICAL FIELD

The present disclosure relates to a semiconductor apparatus and a manufacturing method thereof. More particularly, the present disclosure relates to a semiconductor apparatus in which plural quadrilateral-shaped semiconductor elements are stacked on one surface of a circuit substrate and also a side surface wiring for making electrical connection between each of electrodes of the semiconductor elements and a pad formed on the circuit substrate is formed, and a manufacturing method thereof.

RELATED ART

Density growth has been achieved by arranging semiconductor elements 100, 100 in three dimensions as described in a semiconductor apparatus shown in FIG. 11 with capacity and density growth of a recent semiconductor apparatus. In the semiconductor apparatus shown in FIG. 11, the semiconductor elements 100, 100 are stacked on one surface of a wiring substrate 102 through adhesive layers 104, 104. Wire bonding between pads of the wiring substrate 102 and electrode terminals disposed in the vicinity of each of the peripheral edges of the semiconductor elements 100, 100 is performed by gold wires 106, 106, . . . and the pads are electrically connected to the electrode terminals.

However, as shown in FIG. 11, the pads of the wiring substrate 102 are electrically connected to the electrode terminals disposed in the vicinity of each of the peripheral edges of the semiconductor elements 100, 100 by the wire bonding. Therefore, it becomes necessary to seal the gold wires 106, 106, . . . etc. with a resin in order to protect the gold wires 106, 106, . . . and the finally obtained semiconductor apparatus becomes larger.

As a result of this, in order to miniaturize the semiconductor apparatus in which plural semiconductor elements are arranged in three dimensions, a semiconductor apparatus 200 shown in FIG. 12 has been proposed in the following Patent Reference 1.

In the semiconductor apparatus 200 shown in FIG. 12, side surface wirings 206, 206 are formed on side surfaces of the plural semiconductor elements 204, 204, . . . stacked on the one surface of a wiring substrate 202. The side surface wirings 206, 206 electrically connect pads of the wiring substrate 202 to each of the electrode terminals of each of the semiconductor elements 204, 204, . . . .

[Patent Reference 1] Japanese Patent Application Publication No. 2002-76167

According to the semiconductor apparatus 200 shown in FIG. 12, miniaturization can be achieved as compared with the semiconductor apparatus shown in FIG. 11.

However, as the semiconductor elements 204, 204, . . . constructing the semiconductor apparatus 200 shown in FIG. 12, the semiconductor element in which the electrode terminal is formed on the side surface must be used and a normal semiconductor element in which an electrode terminal is formed on one surface of the semiconductor element cannot be used.

Further, the side surface wirings 206, 206, . . . of the semiconductor apparatus 200 shown in FIG. 12 are formed on the side surfaces of the semiconductor elements 204, 204, . . . after the semiconductor elements 204, 204, . . . are stacked on the one surface of the circuit substrate 202 using a liftoff method and a vapor deposition method. Therefore, and a manufacturing step of the semiconductor apparatus 200 is made troublesome.

By the way, when a semiconductor element in which an electrode terminal is formed on the one surface is used as the semiconductor elements 204, 204, . . . , it is necessary to make a rewiring, whose one end is connected to the electrode terminal, extended to the side surface of the semiconductor element. Therefore, the manufacturing step of the semiconductor apparatus 200 is made troublesome more.

Also, it was proved that a gold wire is cut in the edge of a semiconductor element even when the gold wire whose one end is connected to an electrode terminal of the semiconductor element attempts to be extended along the side surface instead of the rewiring. This is probably because stress tends to be concentrated on the portion corresponding to the edge of the semiconductor element of the gold wire.

Therefore, in the related-art semiconductor apparatus in which plural semiconductor elements are stacked, a normal semiconductor element in which an electrode terminal is formed on its one surface cannot be used and a manufacturing step of the semiconductor apparatus is complicated.

SUMMARY

Exemplary embodiments of the present invention provide a semiconductor apparatus capable of preventing complication of a manufacturing step of the semiconductor apparatus and using a normal semiconductor element in which an electrode terminal is formed on its one surface, and a manufacturing method of the semiconductor apparatus.

The present inventors et al. found that a semiconductor apparatus using a normal semiconductor element can easily be formed and the obtained semiconductor apparatus can also be miniaturized by the following structure. That is, a normal quadrilateral-shaped semiconductor element in which an electrode terminal is formed on its one surface is used as a semiconductor element. A tapered surface is formed by cutting off an edge of a surface on which the electrode terminal is formed (which is referred as electrode terminal formation surface) among edges formed along each of sides of the semiconductor element. A metal wire is connected to the electrode terminal at its one end and is extended along the tapered surface of the semiconductor element. Such a plurality of semiconductor elements are stacked on one surface of a circuit substrate. A side surface wiring for making electrical connection between each of the electrode terminals of the semiconductor elements and a pad formed on the circuit substrate is formed by applying a conductive paste containing metal particles so as to make contact with at least a part of each of the metal wires.

That is, an exemplary embodiment of the invention is a semiconductor apparatus which comprises:

a circuit substrate;

a plurality of quadrilateral-shaped semiconductor elements stacked on the circuit substrate, each of the semiconductor elements having an electrode terminal, each of the semiconductor elements having a tapered surface formed by cutting off at least an edge of an electrode terminal formation surface, on which the electrode terminal is formed, among edges formed along each of sides of the semiconductor element;

a side surface wiring which makes an electrical connection between each of electrode terminals of the semiconductor elements and a pad formed on the circuit substrate; and metal wires, each of which is connected to each of the electrode terminals of the semiconductor elements at its one end and extended along the tapered surface of the each of semiconductor elements, wherein at least a part of the metal wire extended from each of the electrode terminals of the semiconductor elements along the tapered surface makes contact with the side surface wiring and is electrically connected to the side surface wiring.

Also, an exemplary embodiment of the invention is a manufacturing method of a semiconductor apparatus, which comprises:

preparing a plurality of quadrilateral-shaped semiconductor elements, each of the semiconductor elements having an electrode terminal, each of the semiconductor elements having a tapered surface formed by cutting off at least an edge of an electrode terminal formation surface, on which the electrode terminal is formed, among edges formed along each of sides of the semiconductor element;

connecting each of metal wires to each of the electrode terminals of the semiconductor elements at one end of the metal wire and extending the each of metal wires along the tapered surface of the each of semiconductor elements;

stacking the semiconductor elements on a circuit substrate; and forming a side surface wiring which makes contact with at least a part of the metal wire extended from each of the electrode terminals of the semiconductor elements along the tapered surface so as to make an electrical connection between each of electrode terminals of the semiconductor elements and a pad formed on the circuit substrate.

In such exemplary embodiments of the invention, bonding between the metal wire and the side surface wiring can be improved by extending the metal wire to a side surface of the semiconductor element beyond the tapered surface of the semiconductor element.

Also, the semiconductor element may have the tapered surface formed by cutting off the edge of the electrode terminal formation surface and have a tapered surface formed by cutting off an edge of a surface opposite to the electrode terminal formation surface. The conductive paste applied to side surfaces of plural stacked semiconductor element enters a gap between the adjacent semiconductor elements and is provided on the tapered surface. Thus, contact between a gold wire and side surface wiring can be improved. Particularly, bonding between the metal wire and the side surface wiring can be more improved by extending the metal wire to both the tapered surfaces.

In the semiconductor apparatus according to the invention, at least a part of the metal wire, whose one end is connected to the electrode terminal and which is extended along the tapered surface formed by cutting off an edge of the electrode terminal formation surface on which the electrode terminal of the semiconductor element is formed, is in contact with the side surface wiring formed by applying the conductive paste containing metal particles.

In the semiconductor apparatus according to the invention, the metal wire whose one end is connected to the electrode terminal of the semiconductor element is extended along the tapered surface of the semiconductor element thus, so that a normal semiconductor element in which the electrode terminal is formed on the one surface of the semiconductor element can be used.

Also, in the semiconductor apparatus according to the invention, the side surface wiring is formed by applying the conductive paste containing conductive particles, so that its side surface wiring can easily be formed as compared with a related-art semiconductor apparatus in which the side surface wiring is formed using a vapor deposition method and a liftoff method.

In the case of making contact between the metal wire and the conductive paste thus, wettability between the metal wire and the conductive paste is good, so that the conductive paste tends to be gathered on a peripheral surface of the corresponding metal wire and can be prevented from being in contact with the adjacent side surface wiring. Thus, reliability of the finally obtained semiconductor apparatus can be improved.

Moreover, a part of the conductive paste applied to the side surfaces of the plural stacked semiconductor elements can easily enter a gap between the adjacent semiconductor elements and is formed on the tapered surface, and thus, makes contact with a metal wire extended along the tapered surface. As a result of that, the metal wire whose one end is connected to the electrode terminal of the semiconductor element can surely make contact with the side surface wiring and reliability of the semiconductor apparatus can be more improved.

DETAILED DESCRIPTION

Figure 1A:
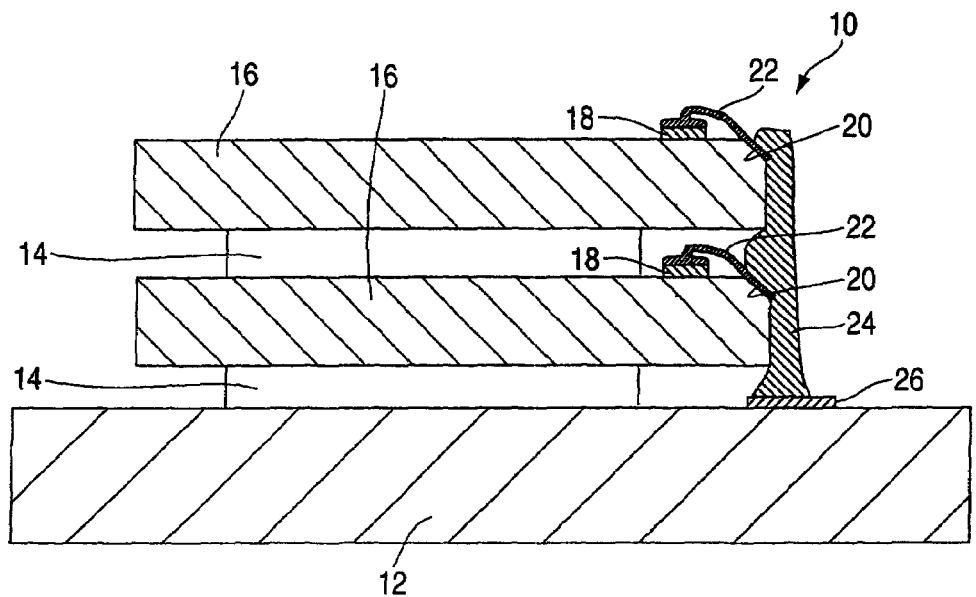
FIG. 1A is a schematic sectional view explaining one example of a semiconductor apparatus according to the invention.
Figure 1B:
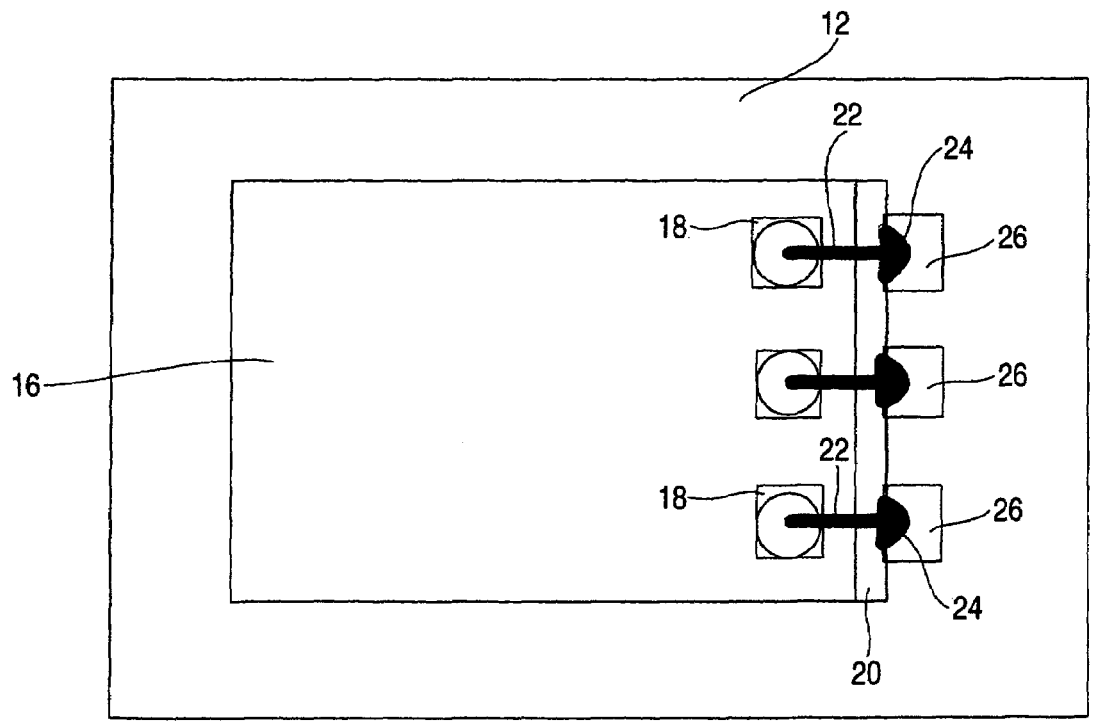
FIG. 1B is a schematic plan view explaining one example of a semiconductor apparatus according to the invention.

FIGS. 1A and 1B show one example of a semiconductor apparatus according to the invention. FIG. 1A is a schematic sectional view of a semiconductor apparatus 10, and FIG. 1B is a schematic plan view of the semiconductor apparatus 10. In the semiconductor apparatus 10 shown in FIG. 1, semiconductor elements 16, 16 are stacked on one surface of a circuit substrate 12 through adhesive layers 14, 14.

Each of such semiconductor elements 16, 16 is a quadrilateral-shaped semiconductor element in which electrode terminals 18, 18, . . . are formed on one surface of the semiconductor element (which is referred as electrode terminal formation surface). A tapered surface 20 is formed by cutting off an edge of the electrode terminal formation surface, on which the electrode terminals 18, 18, . . . are formed, among edges formed along each of sides of this semiconductor element 16. In this embodiment, the tapered surface 20 is formed by cutting off the edge which is closer to the electrode terminals 18, 18, . . . among the edges of the electrode terminal formation surface.

Further, a gold wire 22 as a metal wire is connected to the electrode terminal 18 at its one end and is extended along the tapered surface 20 of the semiconductor element 16.

The gold wire 22 extended along the tapered surface 20 is in contact with a side surface wiring 24. The side surface wiring 24 is formed by applying a conductive paste containing conductive particles such as silver particles, copper particles or carbon particles to side surfaces of the semiconductor elements 16, 16 stacked on the one surface of the circuit substrate 12. The side surface wiring 24 is also in contact with a pad 26 formed on the one surface of the circuit substrate 12.

A part of the side surface wiring 24 formed in side surfaces of the plural stacked semiconductor elements 16, 16 as shown in FIG. 1A enters a gap between the adjacent semiconductor elements 16, 16 and is formed on the tapered surface 20 so that it is in contact with the gold wire 22 extended along the tapered surface 20. As a result of this, the gold wire 22 whose one end is connected to each of the electrode terminals 18 of the semiconductor elements 16, 16 can surely make contact with the side surface wiring 24.

Figure 2A:
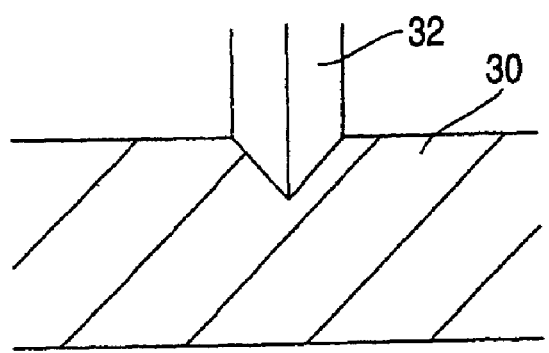
FIGS. 2A to 2C are process views explaining a method for forming a tapered surface of a semiconductor element forming the semiconductor apparatus shown in FIG. 1A.
Figure 2B:
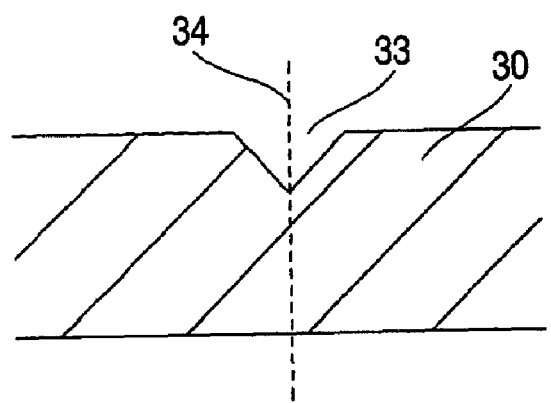
Figure 2C:
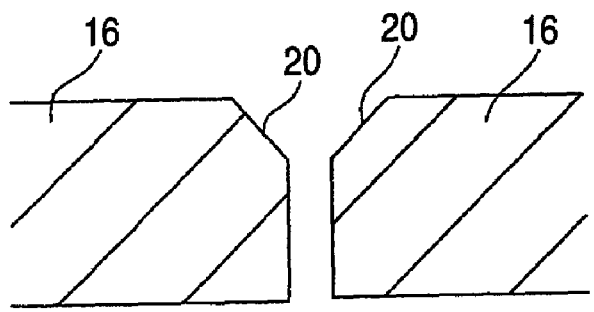

The semiconductor element 16 with the tapered surface 20 used in the semiconductor apparatus 10 shown in FIG. 1 is manufactured as follows. That is, in the case of dicing a wafer 30 in which plural semiconductor elements are made, bevel cutting is performed in the wafer 30 using a blade 32 for bevel cutting as shown in FIG. 2A, and a V-shaped groove 33 is formed in one surface of the wafer 30 as shown in FIG. 2B. The one surface of the wafer 30 in which the V-shaped groove 33 is formed is the electrode terminal formation surface on which the electrode terminals 18, 18, . . . of the semiconductor elements 16 are formed.

Then, the portion on a straight line (shown by a dotted line 34) vertical to the one surface of the wafer 30 and passing the deepest part of the V-shaped groove 33 shown in FIG. 2B is cut by a dicing blade. Therefore, the semiconductor element 16 in which the tapered surface 20 is formed in the edge of the one surface can be obtained.

In the quadrilateral-shaped semiconductor element 16 in which the electrode terminals 18, 18, . . . are formed on the one surface, the gold wire 22 whose one end is connected to the electrode terminal 18 is extended along the tapered surface 20 as shown in FIG. 3A to 3D.

The connection of such a gold wire 22 to the electrode terminal 18 of the semiconductor element 16 and the extension of the gold wired 22 is made using a wire bonder.

Figure 3A:
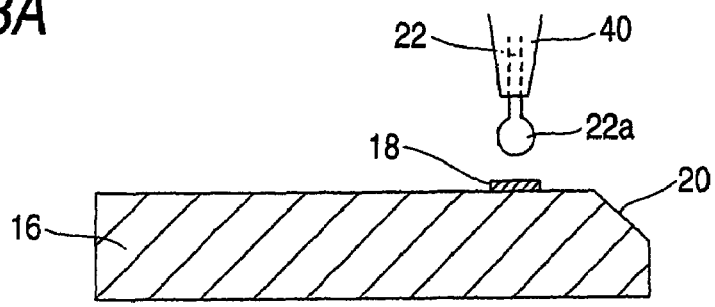
FIGS. 3A to 3D are process views explaining a method for extending a metal wire whose one end is connected to an electrode terminal of the semiconductor element forming the semiconductor apparatus shown in FIG. 1A to a tapered surface.

First, as shown in FIG. 3A, after the top of the gold wire 22 pulled out of the top of a capillary 40 of the wire bonder is melted by a torch and a ball 22a is formed, the ball 22a is crimped on the electrode terminal 18.

Figure 3B:
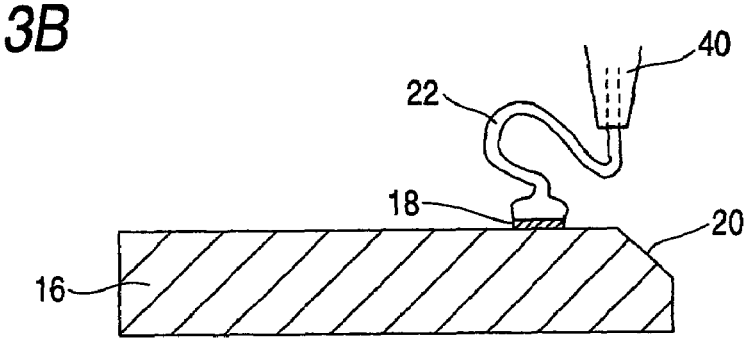

Further, after the capillary 40 is moved in a direction opposite to the tapered surface 20 and the gold wire 22 with a predetermined length is pulled out of the capillary 40, movement of the capillary 40 in a direction of the tapered surface 20 is started as shown in FIG. 3B.

Figure 3C:
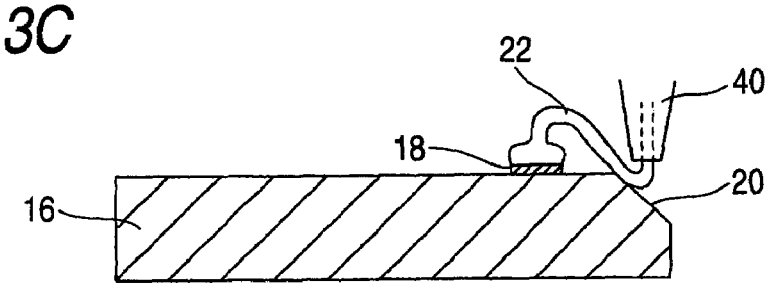
Figure 3D:
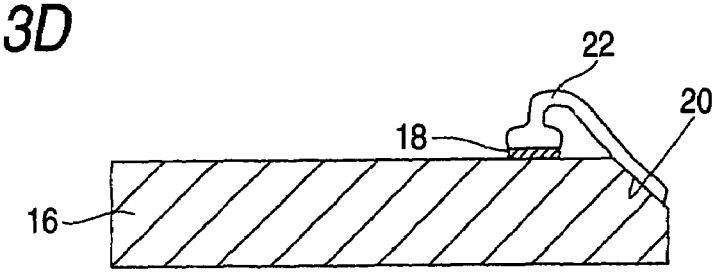

Subsequently, when the capillary 40 is moved in a direction of the other edge side from one edge side of the tapered surface 20 along the tapered surface 20 and the other end of the gold wire 22 whose one end is connected to the electrode terminal 18 is extended to the other edge of the tapered surface 20 as shown in FIG. 3C, the gold wire 22 is torn by the capillary 40 as shown in FIG. 3D.

Figure 4:
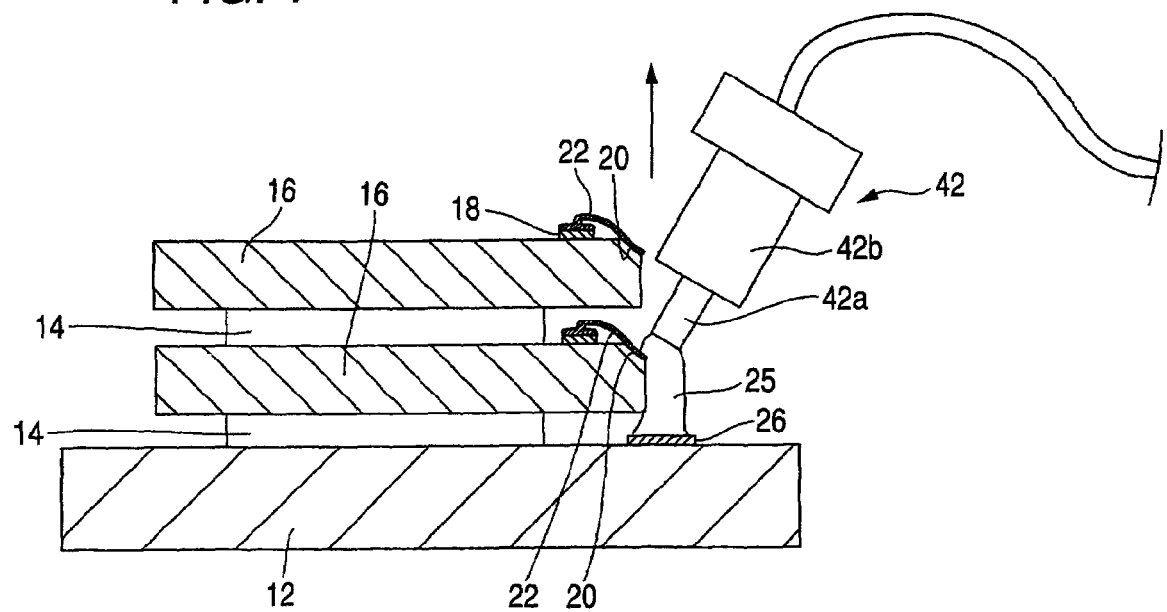
FIG. 4 is an explanatory view explaining a formation method for forming side surface wiring on side surfaces of plural semiconductor elements stacked on the one surface side of a circuit substrate.

Then, the semiconductor elements 16, 16, in which the gold wires 22 whose one ends are connected to the electrode terminals 18 formed on the electrode terminal formation surfaces are extended along the tapered surfaces 20, are stacked on the one surface (surface on which the pad 26 is formed) of the circuit substrate 12 through the adhesive layers 14, 14 as shown in FIG. 4. In this case, the electrode terminal formation surface of the semiconductor element 16 directly installed on the circuit substrate 12 becomes an adhesive surface to which another semiconductor element 16 adheres. The electrode terminal formation surface of another semiconductor element 16 stacked on the semiconductor element 16 becomes an exposed surface.

A conductive paste 25 containing conductive particles such as silver particles, copper particles or carbon particles is applied to the side surfaces of the semiconductor elements 16, 16 stacked on the one surface of the circuit substrate 12 in this manner as shown in FIG. 4. This conductive paste 25 is applied by being discharged from a nozzle 42a to the side surfaces of the stacked semiconductor elements 16, 16 by a gas pressure such as a nitrogen pressure from a filling bath 42b filled with the conductive paste constructing an applicator 42. In this case, the conductive paste 25 can be formed on the side surfaces of the semiconductor elements 16, 16 in a strip shape by moving the applicator 42 from the lower portion to the upper portion (direction of an arrow shown in FIG. 4) of the stacked semiconductor elements 16, 16. One end of this strip-shaped conductive paste 25 is in contact with the pad 26 of the circuit substrate 12.

Further, the conductive paste 25 easily enters a gap between the adjacent semiconductor elements 16, 16 and thus a part of the conductive paste 25 is provided on the tapered surface 20. Therefore, the conductive paste 25 makes contact with the gold wire 22 extended along the tapered surface 20.

Then, the circuit substrate and the semiconductor elements 16, 16 are inserted into a heating furnace and heat-treated. Therefore, the side surface wiring 24 can be formed on the side surfaces of the semiconductor elements 16, 16 and the gold wire 22 whose one end is connected to each of the electrode terminals 18 of the semiconductor elements 16, 16 can be electrically connected to the pad 26 of the circuit substrate 12 by the side surface wiring 24.

Here, wettability between the gold wire 22 and the conductive paste 25 is good. Therefore, the conductive paste 25 tends to be gathered on a peripheral surface of the corresponding gold wire 22 and can be prevented from being in contact with the conductive paste 25 applied to the adjacent gold wire 22. Thus, reliability of electrical connection to the semiconductor elements 16, 16 of the conductive paste 25 can be improved.

Figure 5:
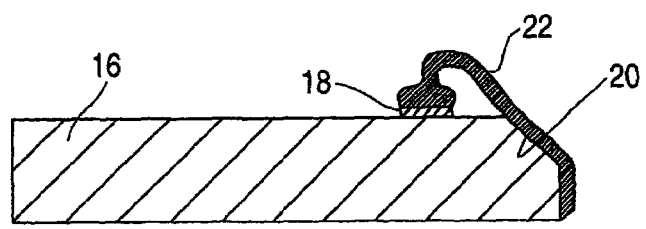
FIG. 5 is a sectional view explaining another example of a semiconductor element used in a semiconductor apparatus according to the invention.

In the semiconductor apparatus 10 shown in FIGS. 1A to 4, the other end of the gold wire 22 whose one end is connected to the electrode terminal 18 of the semiconductor element 16 is extended along the tapered surface 20. However, the other end of the gold wire 22 may be extended along the side surface beyond the tapered surface 20 of the gold wire 22 as shown in FIG. 5.

In this case, the gold wire 22 whose one end is connected to the electrode terminal 18 of the semiconductor element 16 is extended using the capillary 40 of the wire bonder as shown in FIG. 3D. In this case, the gold wire 22 may be torn in the middle of the side surface of the semiconductor element 16, but the gold wire 22 may be torn using the edge of a lower surface (a surface opposite to the electrode terminal formation surface) of the semiconductor element 16 as shown in FIG. 5.

Here, the gold wire 22 can easily be torn in a predetermined place by previously scratching the predetermined place of the gold wire 22 by a clamp etc.

In the semiconductor apparatus 10 shown in FIGS. 1A to 5, a semiconductor element in which the tapered surface 20 is formed in the edge of the electrode terminal formation surface is used as the semiconductor element 16. However, as shown in FIG. 6, a semiconductor element 16, in which each of the edge of the electrode terminal formation surface and the edge of the surface opposite to the electrode terminal formation surface is cut off to form tapered surfaces 20, 20, can be used.

Figure 6:
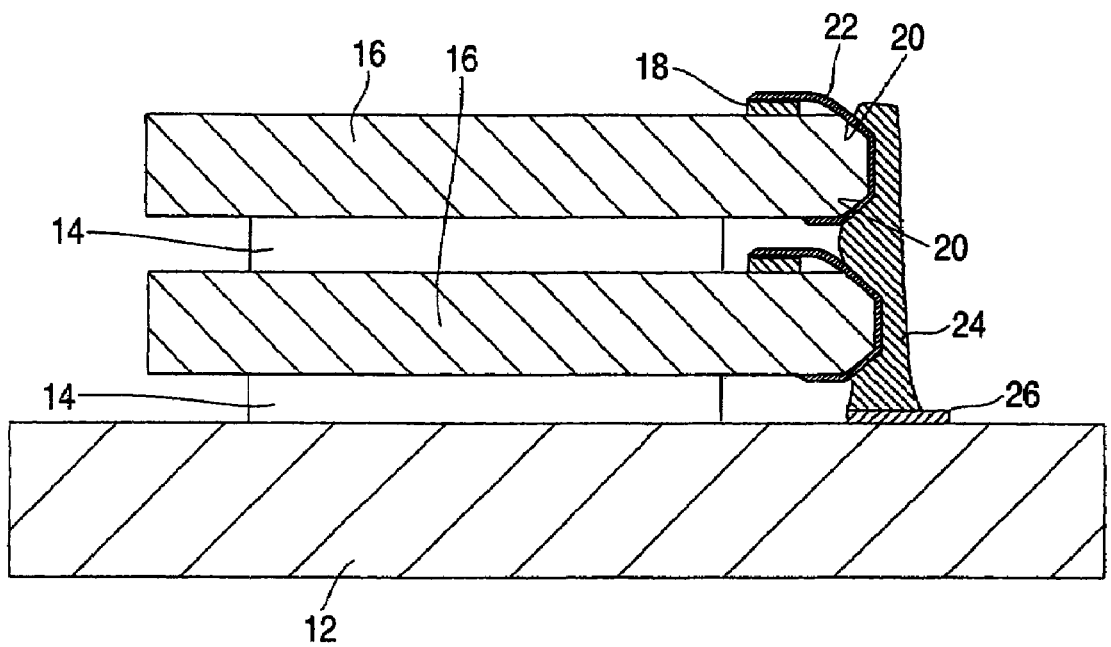
FIG. 6 is a schematic sectional view explaining another example of a semiconductor apparatus according to the invention.

In the case of using such a semiconductor element 16 shown in FIG. 6, the gold wire 22 whose one end is connected to the electrode terminal 18 is extended so as to traverse the tapered surfaces 20, 20. Therefore, a part of the side surface wiring 24 formed on the side surfaces of the semiconductor elements 16, 16 stacked on the one surface of the circuit substrate 12 enters a gap between the adjacent semiconductor elements 16, 16 and is formed on the tapered surfaces 20, 20 and contact between the side surface wiring 24 and the gold wire 22 can be more improved.

Figure 7A:
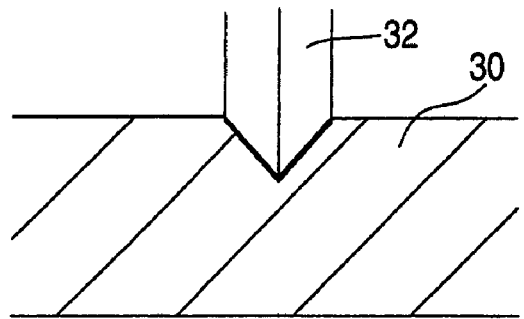
FIGS. 7A and 7B are process views explaining a method for forming a tapered surface of a semiconductor element forming the semiconductor apparatus shown in FIG. 6.

The semiconductor element 16 shown in FIG. 6 in which the tapered surfaces 20, 20 are formed in each of the edge of the electrode terminal formation surface and the edge of the surface opposite to the electrode terminal formation surface is manufactured as follows. That is, in the case of dicing a wafer 30 in which plural semiconductor elements are made, using a blade 32 for bevel cutting, bevel cutting is performed and a V-shaped groove 33 is formed in the one surface of the wafer 30 as shown in FIG. 7A.

Figure 7B:
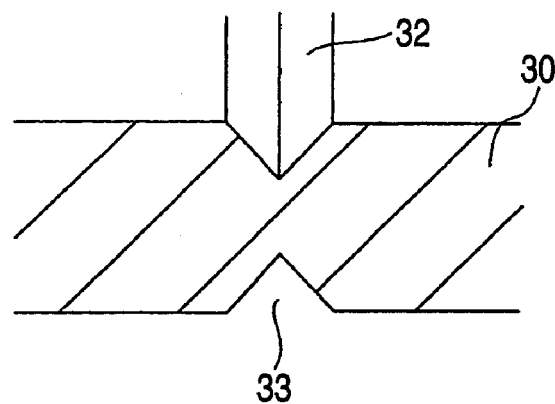

Further, by using the blade 32 for bevel cutting, a V-shaped groove 33 is formed in the other surface of the wafer 30 in a place corresponding to the V-shaped groove 33 formed in the one surface as shown in FIG. 7B.

Then, by cutting the V-shaped grooves 33 formed in both the surface sides of the wafer 30 by a dicing blade, the semiconductor element 16 in which the tapered surfaces 20, 20 are formed in each of the edge of the electrode terminal formation surface and the edge of the surface opposite to the electrode terminal formation surface can be formed.

In the case of extending the gold wire 22 whose one end is connected to the electrode terminal 18 so as to traverse the tapered surfaces 20, 20 formed in the semiconductor element 16, a method shown in FIGS. 8 and 9A to 9C is easy.

Figure 8:
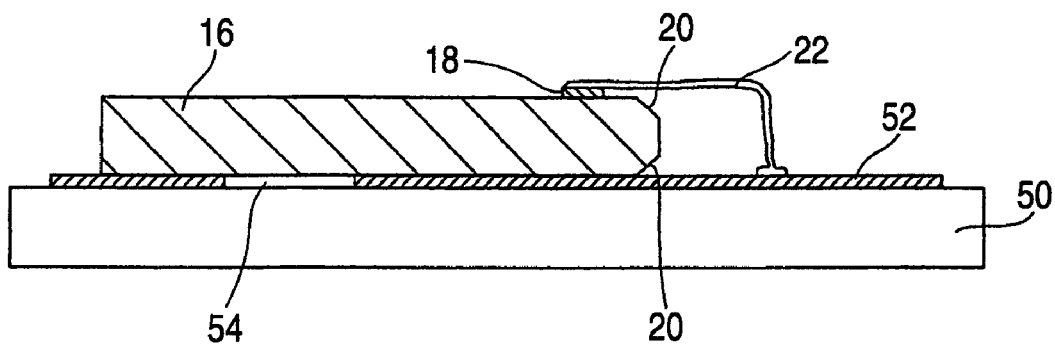
FIG. 8 is a part of the process view explaining the first step of a method for extending a metal wire whose one end is connected to an electrode terminal of the semiconductor element forming the semiconductor apparatus shown in FIG. 6 to both the tapered surfaces.

First, as shown in FIG. 8, metal foil 52 such as aluminum foil is placed on an adsorption plate 50 and also the semiconductor element 16 is placed on a through hole 54 formed in the metal foil 52. The semiconductor element 16 placed on the metal foil 52 is placed so that the electrode terminal formation surface on which the electrode terminal 18 of the semiconductor element is formed faces to an upper surface.

Such metal foil 52 and semiconductor element 16 are respectively adsorbed and fixed in predetermined places of the adsorption plate 50 by developing adsorption force of the adsorption plate 50. In this case, the semiconductor element 16 is adsorbed and fixed in the predetermined place of the adsorption plate 50 through the through hole 54 of the metal foil 52.

In this manner, after one end of the gold wire 22 is connected to the vicinity of the semiconductor element 16 of the metal foil 52 fixed by the adsorption force of the adsorption plate 50 by means of a wire bonder, the gold wire 22 is pulled out of the capillary 40 and the other end of the gold wire 22 is connected to the electrode terminal 18 of the semiconductor element 16 and is torn.

Figure 9A:
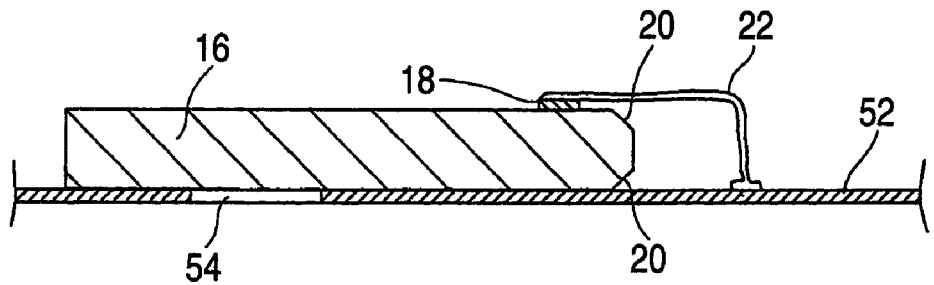
FIGS. 9A to 9C are process views explaining the other steps of the method for extending a metal wire whose one end is connected to the electrode terminal of the semiconductor element forming the semiconductor apparatus shown in FIG. 6 to both the tapered surfaces.

Next, as shown in FIG. 9A, adsorption of the adsorption plate 50 is released and the semiconductor element 16 and the metal foil 52 are taken out of the adsorption plate 50. When the adsorption of the adsorption plate 50 is released, the semiconductor element 16 can be moved.

Figure 9B:
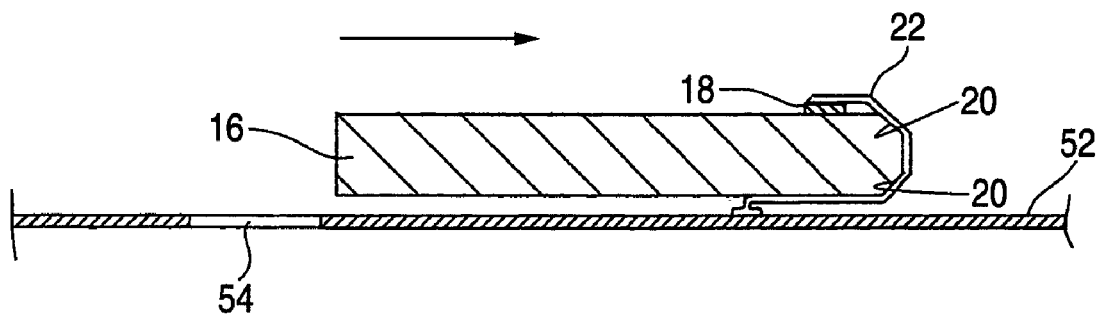

As a result of this, as shown in FIG. 9B, the semiconductor element 16 is moved in a direction (direction of an arrow of FIG. 9B) of the gold wire 22 and a side surface of the semiconductor element 16 is abutted on the gold wire 22 so that the gold wire 22 traverses the tapered surfaces 20, 20 of the semiconductor element 16.

Figure 9C:
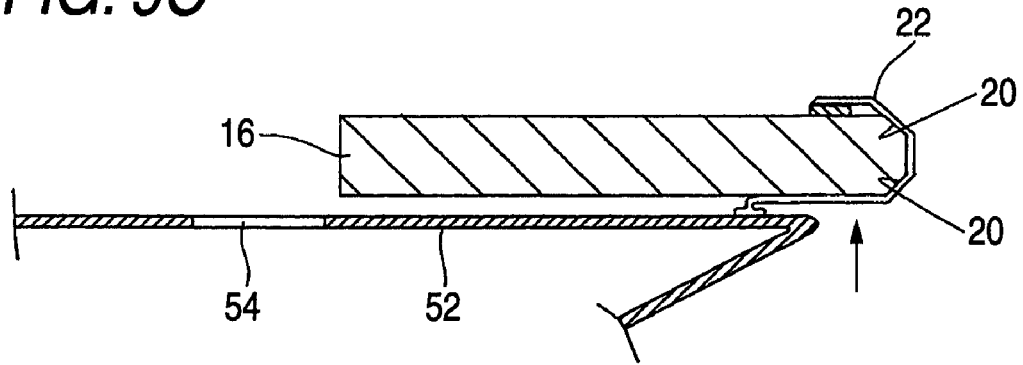

Thereafter, as shown in FIG. 9C, a part of the metal foil 52 is folded and the gold wire 22 extended along the surface opposite to the electrode terminal formation surface of the semiconductor element 16 is exposed. The portion (portion shown by an arrow of FIG. 9C) of the gold wire 22 extended beyond the tapered surface 20 formed in the surface opposite to the electrode terminal formation surface is cut by a cutter etc. Therefore, the semiconductor element 16 in which the gold wire 20 whose one end is connected to the electrode terminal 18 is extended so as to traverse the tapered surfaces 20, 20 can be obtained.

The plural semiconductor elements 16, 16 formed in this manner, in which the gold wires 22 whose one ends are connected to the electrode terminals 18 are extended so as to traverse the tapered surfaces 20, 20 formed in each of the edges of the electrode terminal formation surface and its opposite surface, are stacked on the one surface of the circuit substrate 12 through the adhesive layers 14, 14 as shown in FIG. 4. Then, the conductive paste 25 containing conductive particles such as silver particles, copper particles or carbon particles is applied to the side surfaces of the semiconductor elements using the applicator 42. Therefore, the side surface wiring 24 shown in FIG. 6 can be formed.

In the semiconductor elements 16 shown in FIGS. 6 to 9C, the gold wire 22 whose one end is connected to the electrode terminal 18 is extended so as to traverse both the tapered surfaces 20, 20 and is extended along the surface opposite to the electrode terminal formation surface. However, the gold wire 22 may be extended along the middle or the lower end of the side surface beyond the tapered surface 20 of the electrode terminal formation surface (in this case, the gold wire 22 is not extended along the tapered surface 20 of the surface opposite to the electrode terminal formation surface).

Figure 10:
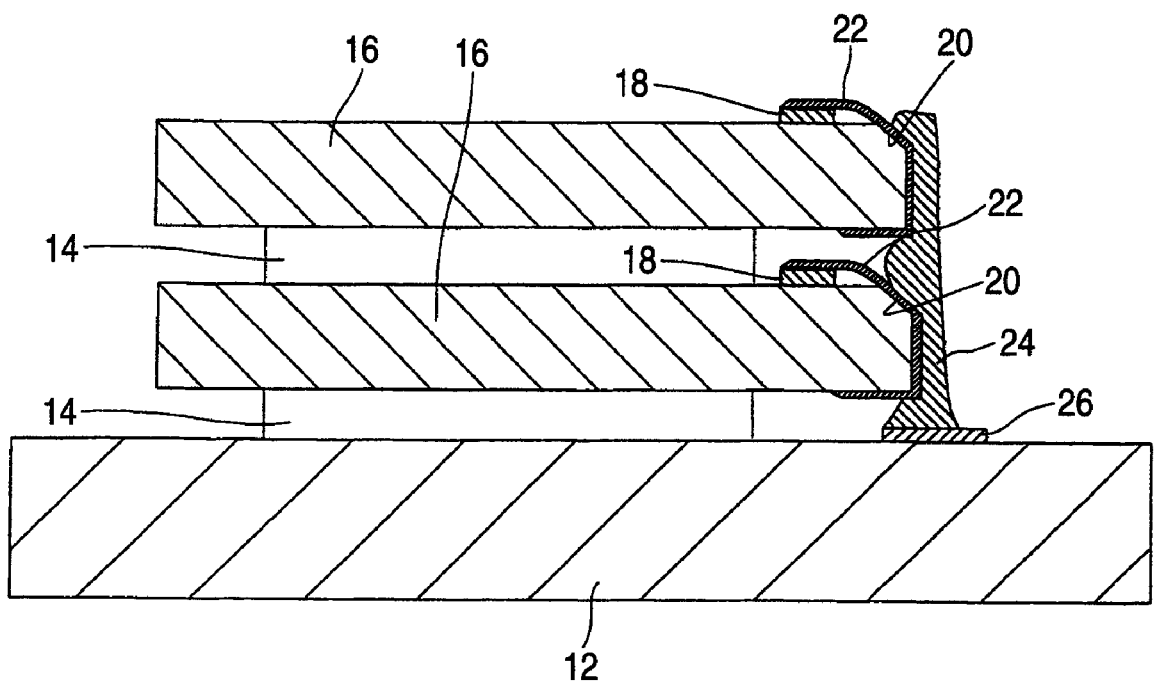
FIG. 10 is a schematic sectional view explaining other example of a semiconductor apparatus according to the invention.
Figure 11:
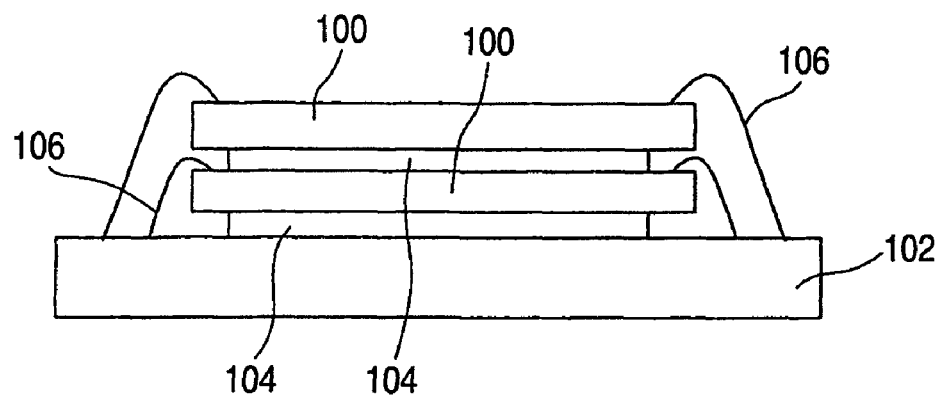
FIG. 11 is a schematic view explaining a related-art semiconductor apparatus.
Figure 12:
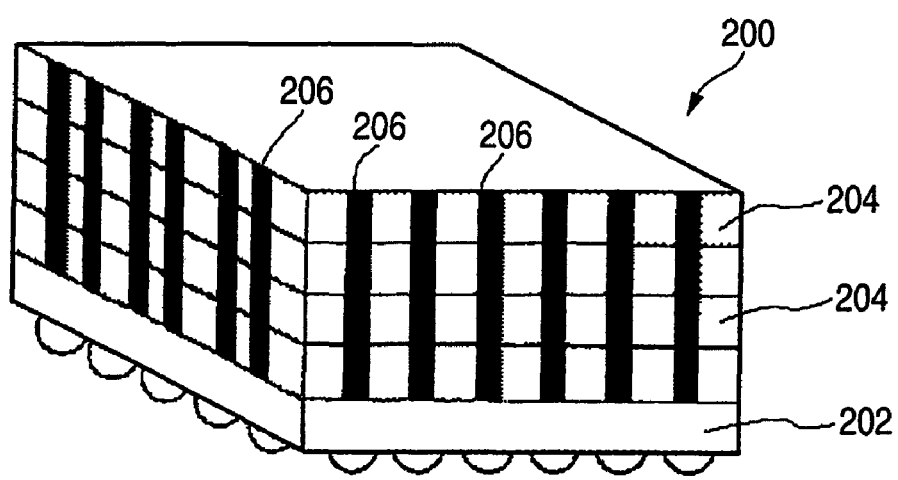
FIG. 12 is a perspective view explaining an improved semiconductor apparatus.

Also, the semiconductor apparatus may be a semiconductor apparatus having a semiconductor element 16 in which a tapered surface 20 is formed in only the electrode formation surface and a gold wire 22 whose one end is connected to an electrode terminal 18 of the semiconductor element 16 is extended along a surface opposite to the electrode formation surface so as to traverse the tapered surface 20 as shown in FIG. 10.

In the semiconductor apparatus shown in FIG. 10, a part of the side surface wiring 24 enters a gap between the adjacent semiconductor elements 16, 16 and is formed on the tapered surface 20 and the gold wire 22 traversing the tapered surface 20 makes contact with the side surface wiring 24 and connection between the gold wire 22 and the side surface wiring 24 can be made surely.

As described in the semiconductor element 16 constructing the semiconductor apparatus shown in FIGS. 6 and 10, when the metal wire 22 whose one end is connected to the electrode terminal 18 of the semiconductor element 16 is extended along the surface opposite to the electrode terminal formation surface on which the electrode terminal 18 is formed, the metal wire 22 may be extended using the capillary 40 of the wire bonder as shown in FIG. 3A. In this case, the gold wire 22 can easily be torn in a predetermined cut place by previously scratching the cut place of the gold wire 22 whose one end is connected to the electrode terminal 18 of the semiconductor element 16 by a clamp etc.

Also, in the semiconductor apparatus shown in FIGS. 1A and 10, the semiconductor elements are stacked so that the electrode terminal formation surfaces of the semiconductor elements 16, 16 are turned in the same direction, but the semiconductor elements 16, 16 may be stacked so that the electrode terminal formation surfaces are mutually opposed.

What is claimed is:

1. A semiconductor apparatus comprising:
   a circuit substrate;
   a plurality of quadrilateral-shaped semiconductor elements stacked on the circuit substrate, each of the semiconductor elements having an electrode terminal formation surface, a side surface, and a tapered surface between the electrode terminal formation surface and the side surface, the tapered surface being formed by cutting off at least an edge of the electrode terminal formation surface, and an electrode terminal formed on the electrode terminal formation surface;
   a side surface wiring provided on each tapered surface and on each side surface which makes an electrical connection between each of the electrode terminals of the semiconductor elements and a pad formed on the circuit substrate; and
   metal wires, each of which is connected by wire bonding to each of the electrode terminals of the semiconductor elements at one end and extended along the tapered surface of each of semiconductor elements,
   wherein at least a part of the metal wire extended from each of the electrode terminals of the semiconductor elements along the tapered surface makes contact with the side surface wiring and is electrically connected to the side surface wiring.

2. A semiconductor apparatus as claimed in claim 1, wherein the side surface wiring is formed by a conductive paste containing conductive particles.

3. A semiconductor apparatus as claimed in claim 1, wherein the metal wire is extended along the side surface of the semiconductor element beyond the tapered surface of the semiconductor element.

4. A semiconductor apparatus as claimed in claim 1, wherein the semiconductor element has the tapered surface formed by cutting off the edge of the electrode terminal formation surface and has a tapered surface formed by cutting off an edge of a surface opposite to the electrode terminal formation surface.

5. A semiconductor apparatus as claimed in claim 4, wherein the metal wire is extended along both the tapered surfaces.

* * * * *